(12) United States Patent
Russell

(10) Patent No.: US 7,620,946 B2
(45) Date of Patent: Nov. 17, 2009

(54) PROGRAM SLICING FOR CODESIGN OF EMBEDDED SYSTEMS

(76) Inventor: Jeffry Thomas Russell, 8206 Sandalwood Cv, Austin, TX (US) 78757

(*) Notice: Subject to any disclaimer, the term of this patent is extended or adjusted under 35 U.S.C. 154(b) by 885 days.

(21) Appl. No.: 10/429,370

(22) Filed: May 5, 2003

(65) Prior Publication Data

US 2004/0226006 A1   Nov. 11, 2004

(51) Int. Cl.
*G06F 9/44* (2006.01)
*G06F 9/45* (2006.01)

(52) U.S. Cl. .................. 717/157; 717/126; 717/132; 717/133; 717/156

(58) Field of Classification Search ......... 717/132–133, 717/144, 156–157
See application file for complete search history.

(56) References Cited

U.S. PATENT DOCUMENTS

| | | | |
|---|---|---|---|
| 5,161,216 A * | 11/1992 | Reps et al. | 717/156 |
| 5,428,793 A * | 6/1995 | Odnert et al. | 717/157 |
| 5,485,616 A * | 1/1996 | Burke et al. | 717/133 |
| 5,555,417 A * | 9/1996 | Odnert et al. | 717/156 |
| 6,301,700 B1 * | 10/2001 | Choi et al. | 717/116 |
| 7,234,126 B2 * | 6/2007 | Catthoor et al. | 716/18 |

OTHER PUBLICATIONS

Tanenbaum, Andrew S., "Structured Computer Organization", Second Edition, Prentice-Hall, Inc., 1984, pp. 10-11.*
Cheng, "Dependence Analysis of Parallel and Distributed PRograms and Its Applications", 1997, IEEE-CS International Conference on Advances in Parallel and Distributed Computing, pp. 370-377.*
Russell, "Program Slicing for Codesign", 2002, CODES'02, pp. 91-96.*
Cheng, "Slicing Concurrent Programs—A Graph-Theoretical Approach", 1993, Proceedings of the First International Workshop on Automated and Algorithmic Debugging, pp. 223-240.*
Nanda et al. "Slicing Concurrent Programs", 2000, ISSTA'00, pp. 180-190.*
Weiser "Program Slicing", 1981 IEEE, pp. 439-449.*
Krinke "Static Slicing of Threaded Programs", 1998, ACM SIGPLAN-SIGSOFT workshop on Program analysis for software tools and engineering, pp. 35-42.*
Iwaihari et al. "Program slicing on VHDL descriptions and its applications" 1996, In Proc. 3rd APCHDL'96, pp. 132-139.*

* cited by examiner

*Primary Examiner*—Jason Mitchell

(57) ABSTRACT

The present invention is a machine implemented, design automation method that assists a designer in the understanding of a software and/or hardware source code specification by transforming the source code into a simplified specification called a program slice. The present invention extends graph-based program slicing to the hardware-software interface that is commonly found in embedded systems. In addition to the known benefits of program slicing applied to a pure software or pure hardware, the present invention aids a designer in understanding the complex interaction between software procedures and hardware processing elements in the context of a codesign methodology.

20 Claims, 14 Drawing Sheets

40

```
41 ─── int proc1( int a, int b)
          {
43 ┌         int c=0;
             int d=1;
   └         int e;

44 ─────  if(b)
45 ┌      {      c=a+1;
   └             d=d+b;
          }
          e=c+d;
47 ─────  return e;
          }
```

51A — function integer proc1;
51B — input a, b;
52 — integer c, d, e;

53
```
begin
    c=0;
    d=1;
```

54 — if(b) begin

55
```
    c=a+1;
    d=d+b;
end
```

```
e=c+d;
```
57 — proc1=e;

```
end
endfunction
```

Fig. 3
Prior Art

```
algrithm MarkSdg
input     Crit : node in Sdg, the slicing criterion
global    Sdg : system dependence graph for all procedures
declare   Visited[] : Sets of nodes visited, one set per call context
          WorkList : Set of Sdg nodes
          p, m, n : Nodes in Sdg.
          .stack : a node call context stack, initially empty.
          .context() : node method, returns current call context
          .push() : node method, puts new call context on stack
          .pop() : node method, removes call context from stack
          θ(v) : function that returns the process containing v.
begin MarkSdg
    WorkList := Crit //initialize with slicing criterion
    while Worklist ≠ ∅ do
        Select and remove node n from WorkList
        Mark n // part of slice
        Add n to Visited[n.context()] // visited node for context
        foreach m ∉ Visited[n.context()] with edge (m,n) do
            if (m,n) ∈ {control, flow } then
                m.stack := n.stack
                Insert m into Worklist
            elseif (m,n) ∈ {call , param-in } then
                if n.current() is empty then
                    Reset m.stack // no calling context
                    Insert m into Worklist
                else
                    if (m,n) labled with n.current() then
                        m.stack := n.stack
                        m.pop()
                        Insert m into Worklist
                    endif
                endif
            elseif (m,n) ∈ { param-out } then
                m.stack := n.stack
                m.push( (m,n) label) // saves call context
                Insert m into Worklist
            elseif (m,n) ∈ {interfer } then
                if ( θ(m), θ(n) ) is valid thread order then
                    Reset call stack for m
                    Insert m into Worklist
                endif
            elseif (m,n) ∈ {signal } then
                Reset m.stack // no calling context
                Insert m into Worklist
            elseif (m,n) ∈ {access } then
                Mark m // in slice, but not completely visited
                foreach p with edge (p,m) of type {control }do
                    Reset p.stack // no calling context
                    Insert p into Worklist
                endfor
            endif
        endfor
    endwhile
end MarkSdg
```

Fig. 15

PROGRAM SLICING FOR CODESIGN OF EMBEDDED SYSTEMS

CROSS-REFERENCE TO RELATED APPLICATIONS

Not applicable.

STATEMENT REGARDING FEDERALLY SPONSORED RESEARCH

Not applicable.

REFERENCE TO LISTING

Not applicable.

BACKGROUND OF THE INVENTION

The present invention relates to design automation for embedded system design and particularly to structural analysis of software programming language and hardware description language specifications.

An embedded system is a computer with a specific software application that interacts with its environment. The state of technology for embedded system design emphasizes concurrent design of the hardware and software, commonly referred to as "codesign". Software portions of an embedded system are often specified using a programming language that is subsequently compiled into machine code suitable for execution by a reprogrammable processing element. Behavioral aspects of hardware portions of an embedded system are often specified using a hardware description language that is subsequently compiled into hardware circuits. A useful codesign methodology includes design automation tools that assist a designer in the manipulation, analysis, and transformation of hardware and software source code specifications.

The programming interface between software and hardware processing elements can be viewed as a collection of shared memory locations and procedures that are sensitive to or activated by access to memory locations. The shared memory may reside on a variety of physical components, for example microprocessor registers, main storage memory, or a coprocessor such as an I/O controller. The software procedures use load and store operations to access shared memory, including registers on a coprocessor. The hardware behavioral description has equivalent operations to access shared memory. The programming interface across the hardware-software boundary is commonly specified in databooks, programming guides, and other static descriptions. Such written descriptions make it difficult for a designer to understand the interacting behavior of the hardware-software interface. A further drawback of written descriptions is the difficulty of correlating described behavior with observed behavior during debugging activity. A beneficial way to describe software and hardware behavior is in terms of source code specifications, and design automation tools that aid in the understanding of such source code specifications are beneficial for a codesign methodology.

Program slicing is a software analysis method to find the subset of program statements that may affect the computation at a particular program point. This program point, which may be defined as a statement or a particular variable used at a statement, is called the slicing criterion. In the simple case of a single entry, single-exit program, a slice is determined by finding all the transitive data flow and control dependences that lead to the slicing criterion. Slicing is useful as a maintenance or reuse tool for activities such as program understanding, debugging, regression testing, and function extraction from existing code. As an interactive tool, a program slicer facilitates understanding of relevant portions of the software by directly transforming the source code into a simplified specification.

Program slicing was introduced by Weiser ["Program Slicing," *IEEE Transactions on Software Engineering*, vol. 10, no. 4, pp. 352-357, 1984] who defined a slicing criterion as any subset of program variables at a statement. The program slice consists of those statements that may affect the values of the criterion variables, including whether or not the statement executes. The Weiser slice is computed by iteratively solving data and control flow equations based on a control flow graph representation of a software program.

A control flow graph (CFG) is a representation of a program suitable for systematic analysis, derived from an imperative language source code specification using standard techniques as described, for example, by Aho et al. in [*Compilers, Principles, Techniques, and Tools*, Addison-Wesley, 1986]. A control flow graph consists of operations and control paths between operations. A flow graph is an equivalent representation that consists of basic blocks and control paths between the basic blocks. A basic block is a sequence of operations that always execute as a group. A control flow graph is a common representation for source code analysis, and standard techniques exist to find control dependence relationships and data flow dependence relationships.

Program slice computation was also formulated as a graph reachability problem as described in U.S. Pat. No. 5,161,216 to Reps et al. (1992). The graph-based approach is better suited for programs with multiple procedures, as it can explicitly represent procedure calling contexts. The methods described by Reps et al. are based on specialized control and data dependences to analyze interprocedural relationships of sequential software programs.

In a graph-based approach, a system dependence graph (SDG) summarizes the control and data dependences of an entire program. The SDG is composed of one or more procedure dependence graphs (PDG), where each PDG summarizes intra-procedure control and data flow dependences. The PDGs, one for each procedure in the program, are connected in the SDG with edges that summarize the inter-procedure data and control dependences. A graph-based approach allows a more precise calculation of a slice compared to the use of data and control equations, as explained by Agrawal et al. ["Dynamic program slicing," *ACM Sigplan Not.* vol. 25, no. 6, pp. 246-256, 1990] and Reps et al. ["Precise interprocedural chopping," *Proc. 3rd ACM SIGSOFT Symposium onthe Foundations of Software Engineering*, pp. 41-52, 1995]. A more precise slice is superior in the sense that it includes fewer statements in a slice.

Extensions to apply graph-based program slicing for concurrent programs were proposed by Krinke ["Static slicing of threaded programs," *ACMSigplan Not.* vol. 33, no. 7, pp. 35-42, 1998] and Nanba et al. ["Slicing Concurrent Programs," *Proc. Int. Symp. Software Testingand Analysis* pp. 180-190, 2000], though with severe restrictions on the type of software programs that could be analyzed. A threaded CFG was defined such that all parallel threads were explicitly indicated in a single CFG, which then could be analyzed to find interference dependences, which are data flow dependences between parallel software threads, as well as feasible execution order for the multiple software threads.

Hardware description languages such as VHDL or Verilog specify the structure and behavior of electronic circuits. The basics of applying slicing to VHDL descriptions were introduced by Iwaihara et al. ["Program slicing on VHDL descriptions and its applications," *Third Asian Pacific Conf Hardware Description Languages*, pp. 132-139, 1996.] using techniques based on a data and control flow equations. Iwaihara et al. defined a signal dependence to represent both a control dependence that activates an operation and a data dependence between potentially concurrent operations. The data dependence aspect is similar to the interference dependence proposed by Krinke et al., supra.

An application of slicing for Verilog hardware descriptions based on data and control flow equations for the purpose of verification testing was proposed by ["Program slicing for hierarchical test generation," *Proc 20th VLSI Test Symposium*, pp. 237-243, 2002.]. Vedula et al. described a signal dependence as a pure control dependence and developed theoretical ideas to support the application of program slicing for automated test pattern generation.

A work by Clarke et. al. ["Program slicing of hardware description languages," *Proc. 10th Adv. Res. Work. Conf Correct Hard.Design and Ver. Methods*, pp. 298-312, 1999.] defined slicing for VHDL based on a graph representation derived by first mapping VHDL language constructs to a procedural software language such as C. Clarke et al. mapped a signal dependence to a function call and introduced a synthetic master process that continuously invokes the non-halting VHDL procedures. The work by Clark et al. does not address the issue of analyzing software and hardware concurrently.

SUMMARY OF THE INVENTION

The present invention is a machine implemented, design automation method that assists a designer in the understanding of a software and/or hardware source code specification by transforming the source code into a simplified specification called a slice, program slice, or source code slice. The invention extends graph-based program slicing to the hardware-software interface that is commonly found in embedded systems. In addition to the known benefits of program slicing applied to a pure software or pure hardware, the present invention aids a designer in understanding the complex interaction between software procedures and hardware processing elements.

In accordance with the illustrative embodiment of the present invention, a process implemented in a computer parses a combined hardware-software source code specification and interactively displays simplified views of the source code to assist a designer in understanding system behavior.

An object of the present invention is to extend the interprocedural slicing techniques, which have exclusively addressed either software programs or hardware description language modules, to the codesign of embedded systems based on a dependence analysis across the hardware-software interface.

A further object of the present invention is a consistent representation for software and hardware procedures via an augmented system dependence graph. Concurrency between software and/or hardware processes is modeled via the interference dependence and inter-process control dependences. A novel access dependence and its representation are described. The access dependence models a memory-access side effect that results in activation of a process. A software process may be activated by a signal or a memory access from a hardware procedure.

A further object of the present invention is to systematically compute a slice based on a plurality of dependences, where the affect on the slice can be tuned by inclusion or exclusion of particular dependence relationships.

Further objects and advantages of the present invention will become apparent from a consideration of the drawings and ensuing description.

BRIEF DESCRIPTION OF DRAWINGS

The present invention will be described by way of exemplary embodiments, but not limitations, illustrated in the accompanying drawings in which like references denote similar elements, and in which:

FIG. 2 lists a software programming language specification of example procedure proc 1( );

FIG. 3 lists a hardware description language specification of example function proc 1( );

FIG. 15 shows a worklist algorithm to compute a slice.

DETAILED DESCRIPTION OF THE INVENTION

The present invention is a design automation method implemented as a programmed computer. The invention analyzes a design specification that is expressed using a combination of software programming language and hardware description language. Under direction of a user, the present invention generates and displays a simplified representation of the original specification. The simplified representation is useful for the design, maintenance, and debugging of an embedded system.

Figure 1:
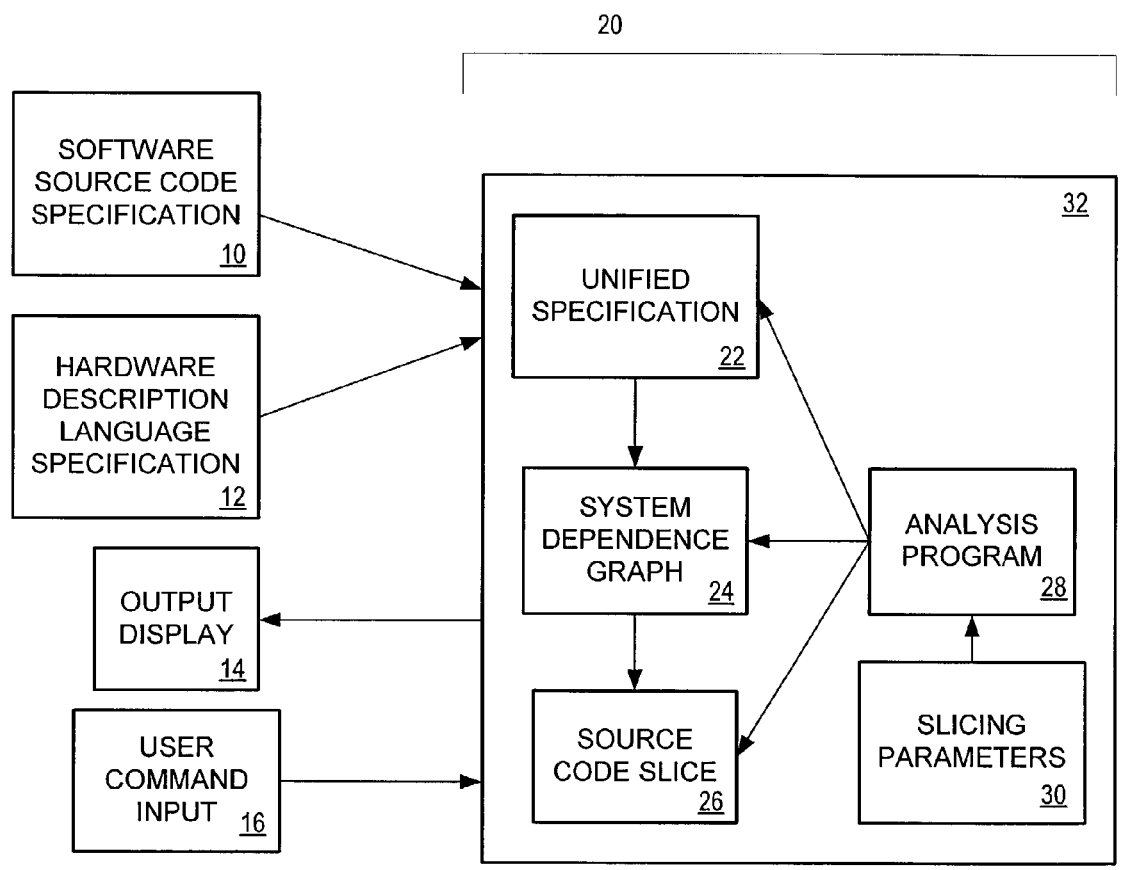
FIG. 1 shows an overview of the invention as the preferred embodiment of a programmed computer.

FIG. 1 is an overview of the present invention 20 implemented as a programmed computer 32. Invention 20 accepts as input a software programming language specification 10 and a hardware description language specification 12. The term "source code" refers language specifications 10, 12 irrespective of whether the specification is a hardware or software specification. Software specification 10 and hardware specification 12 are represented as a unified specification 22. A system dependence graph 24 summarizes important relationships between primitive operations of unified specification 22. A source code slice 26 is calculated or computed from system dependence graph 24. An analysis program 28 controls computer 32 to process, manipulate, or manage unified specification 22, system dependence graph 24, source code slice 26, and all other data structures. A slicing parameter set 30 stores user defined options to influence calculation of slice 26 by analysis program 28. A user interacts with invention 20 via an output display 14 and user command input interface 16.

Analysis program 28 implements the processes, methods, and algorithms described herein such that software specification 10 and hardware specification 12 are analyzed and transformed into slice 26 based on user input 16. Slice 26 is output to display 14.

In the preferred embodiment, software specification 10 is an imperative programming language such as C or FORTRAN and hardware s pecification 12 is a hardware description language such as Verilog or VHDL. Such diverse languages are parsed, analyzed, or transformed into unified specification 22 to support systematic analysis and processing. Appropriate data structures are used in the unified specification 22 to map or correlated elements of unified specification 22 to elements in the original specifications 10, 12.

Source code specifications 10, 12 describe one or more executing processes, where each process is described as one or more procedures, functions, routines, or modules. The term "procedure" is used to refer to both software and hardware, unless explicitly labeled as software or hardware. Each procedure is specified as a sequence of statements based on the programming language or hardware description language. Statements from software specification 10 and hardware specification 12 are parsed, analyzed, or translated into primitive operations of unified specification 22. Operations manipulate storage variables or impact the flow of control of the procedure. Standard compiler techniques are used to translate specifications 10, 12 into unified specification 22.

Unified specification 22 is implemented as a plurality of standard control flow graphs. The control flow graphs of unified specification 22 are analyzed to compute system dependence graph 24. System dependence graph 24 summarizes the dependences between operations, procedures, and processes of unified specification 22. Data structures are maintained to correlate elements of system dependence graph 24 to elements of unified specification 22.

Slice 26 is computed by analysis program 28 based on system dependence graph 24 and a slicing criterion from slicing parameter set 30. Slice 26 consists of a subset of nodes from system dependence graph 24. Data structures are maintained to correlate elements of slice 26 to elements of system dependence graph 24. Each element of slice 26 is thus correlated to statements in specifications 10, 12. Slice 26 is output to display 14 in a format that indicates the subset of statements from specifications 10, 12 that belong to slice 26.

An alternate embodiment of the present invention accepts input source code specifications 10, 12 in a language or format that directly specifies a control flow graph or flow graph.

Subsequent sections of this description describe the representation and computation of unified specification 22, system dependence graph 24, and slice 26.

Detailed Description—Unified Specification

The preferred embodiment of the present invention is described in terms of directed graphs. A directed graph consists of a finite set of nodes and a finite set of edges. Edges are ordered, two-element subsets of the set of nodes. An edge connects a source node to a target node. Nodes and edges are implemented as data structures that represent or model the directed graph, properties associated with the nodes and edges, and other aspects of the invention that will be apparent from subsequent detailed description. Methods or procedures that operate on the graph, node, and edge data structures may be implemented as global procedures, for example using the C language, or as methods associated with particular data structures, for example using the C++ language.

The preferred embodiment of unified specification 22 is a control flow graph (CFG) for each procedure. A CFG represents a single entry, single exit procedure P as a directed graph $G=(N,E)$ where the set of nodes N contains two special nodes $n_s \in N$ and $n_c \in N$, and for each node $n \in N$ there is a walk from start node or entry node $n_s$ to end node or terminal node $n_c$ that includes n. The nodes represent operations of P and each node contains data structures that represent operations of unified specification 22. Edges represent flow of control. Edges are labeled with the predicate value of the source node that determines when the flow is active. The start node is a control predicate operation that models activation of the procedure.

FIG. 2 illustrates an example of software programming language specification 10 as a procedure specification 40. The programming language is C. A statement 41 is used to define the procedure named "proc 1( )" and defines two input parameters "a" and "b". A group of statements 43 declares variables and assigns values to some of the variables. A control statement 44 is a control statement that determines the next statement that execute based on the value of variable "b". A group of statements 45 execute if "b" is non-zero as specified in statement 44. A statement 47 specifies the return value for procedure 10.

FIG. 3 illustrates an example of hardware description language specification 12 as a function specification 50. The hardware description language is Verilog. A statement 51A is used to define the function named "proc 1 ( )". A statement 51B is used to define two input parameters "a" and "b". A statement 52 declares variables used in the function. A group of statements 53 assigns values to some variables declared in statement 52. A control statement 54 determines the next statement that executes based on the value of variable "b". A group of statements 55 execute if "b" is non-zero as specified in statement 54. A statement 57 specifies the return value for function 50.

Figure 4:
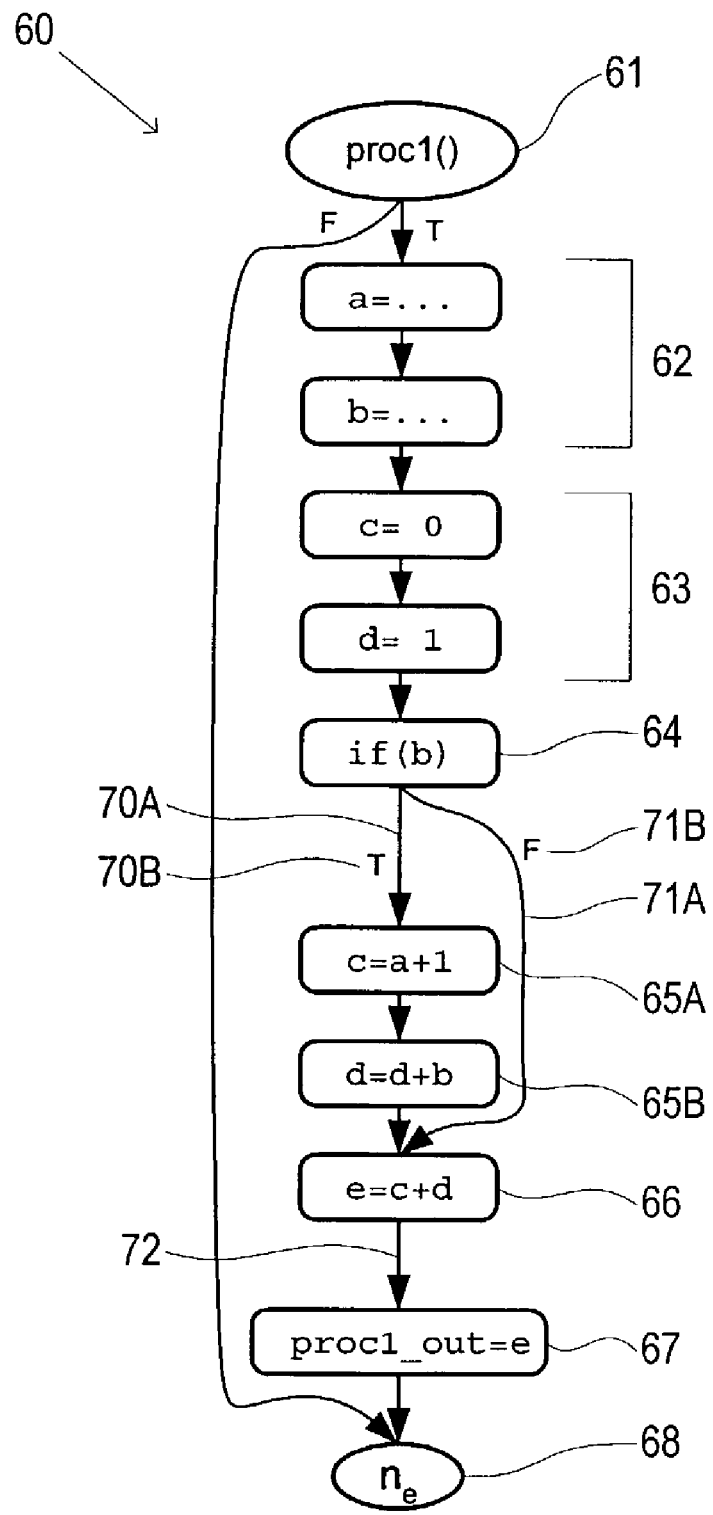
FIG. 4 depicts a control flow graph representation of procedure proc 1( )

FIG. 4 illustrates an example of unified representation 22 as a control flow graph 60. Control flow graph 60 is capable of representing both software procedure 40 and hardware function 50. In the preferred embodiment, control graph 60 represents only one particular source code procedure. An entry node 61, which is labeled "proc1 ( )", is the special entry node $n_s$ from the preceding CFG definition. A group of parameter-in nodes 62 represents input parameters. A group of nodes 63 represents variable assignment operations. A node 64 represents a control flow operation. A node 65A is an assignment operation, and a node 66 is an assignment operation. A conditional control flow edge 70A connects node 64 to node 65A. A conditional control flow edge 71A connects node 64 to a node 66. Edges 70A, 71A represent potential flows of control in a procedure. A label 70B, with the value "T", is associated with edge 70A. Likewise, a label 71B, with the value "F", is associated with edge 71A. A node 65B is an assignment operation. A parameter-out node 67 is an assignment operation for the procedure return value. An unconditional control flow edge 72 is one of a plurality of unconditional control flow edges in graph 60. Edge 72 connects node 66 to node 67 and represents an unconditional flow of control from node 66 to node 67. A terminal node 68 corresponds to terminal node ne from the preceding CFG definition.

Control flow graph 60 models execution of operations based on the edges of the directed graph. Execution follows edges, and control operations have multiple outbound edges. Each edge is labeled with a predicate value associated with the control operation. When the control operation resolves a predicate to a value that matches an edge label, the particular control flow with the matching label is activated.

Referring to FIG. 4, node 64 is a control operation that evaluates to Boolean value true if variable "b" is non-zero. If control operation 64 evaluates true, which matches edge label 70B with the value "T", edge 70A is followed and the next operation to execute is node 65A. If control operation 64 evaluates false, which matches the edge label 711B with the value "F", edge 71A is followed.

Referring to nodes in FIG. 4, and statements from both FIG. 2 and FIG. 3, correspondence from nodes of control flow graph 60 to the statements from software procedure 40 and hardware function 50 are explained. As previously stated, control flow graph 60 of unified representation 22 represents only one procedure from source code specifications 10, 12. However, the correspondence to both software procedure 40 and hardware function 50 are explained to illustrate operation of the present invention. Entry node 61 corresponds to procedure definition statement 41 and function definition statement 51A. Parameter-in nodes 62 correspond to the input parameter definition portion of procedure definition statement 41 and the function parameter definition statement 511B. Nodes 63 correspond to statement groups 43, 53. Control operation node 64 corresponds to statements 44, 54. Control flow edges 70A, 71A and edge labels 70B, 71B correspond to the semantics of the source code statements 44, 54. Nodes 65A, 65B correspond to statement groups 45, 55. Parameter-out node 67 corresponds to statements 47, 57.

Control flow graph 60 demonstrates that unified representation 22 can represent either a software procedure 40 or a hardware function 50, hence the name "unified representation".

Detailed Description—System Dependence Graph

In general graph theory, a node d dominates a node m in a control flow graph G if every path from the start node $n_s$ to node m goes through d. A node m is post-dominated by a node p in control flow graph G if every path from m to $n_1$ (not including m) contains p.

The definition of control dependence follows. Let G be a CFG. Let $n_1$ and $n_2$ be nodes in G. Node $n_2$ is control dependent on $n_1$ if and only if:

1. there exists a path P from $n_1$ to $n_2$ with any internal node n∈P post dominated by $n_2$; and
2. node $n_1$ is not post-dominated by $n_2$ Note that $n_1$ will always have two or more outbound control flow edges in the CFG if it is the source of a dependence relation.

The definition of data flow dependence follows. Let G be a CFG. Let $n_1$ and $n_2$ be nodes in G. Node $n_2$ is data flow dependent on $n_1$ if and only if:

1. there exists a walk W from $n_1$ to $n_2$ with such that no interior node n∈W defines variable v; and
2. variable v is defined by $n_1$ and used by $n_2$.

The procedure dependence graph (PDG) is a procedure representation that makes explicit both the data flow and control dependences for each operation. The procedure dependence graph for a procedure P is a directed graph G=(N, E). The nodes N represent the operations of the procedure. The set of nodes of the PDG are the same as the set of nodes of the control flow graph for procedure P. The edges E represent dependences between operations. An edge represents that the target node is dependent on the source node. Edge data structures for the PDG are annotated to indicate the type of dependence. Note that multiple edges are possible between any two nodes, as multiple dependence relationships may exist.

The PDG for a procedure is constructed by copying the set of nodes to a new graph. Edges are added to the new graph by examining each node in the procedure CFG for control dependences and data flow dependences, adding an edge for each dependence found.

An alternate embodiment uses the same data structure with additional attributes to represent both CFG nodes and PDG nodes. The graphs are then distinguished by the respective edge sets.

Figure 5:
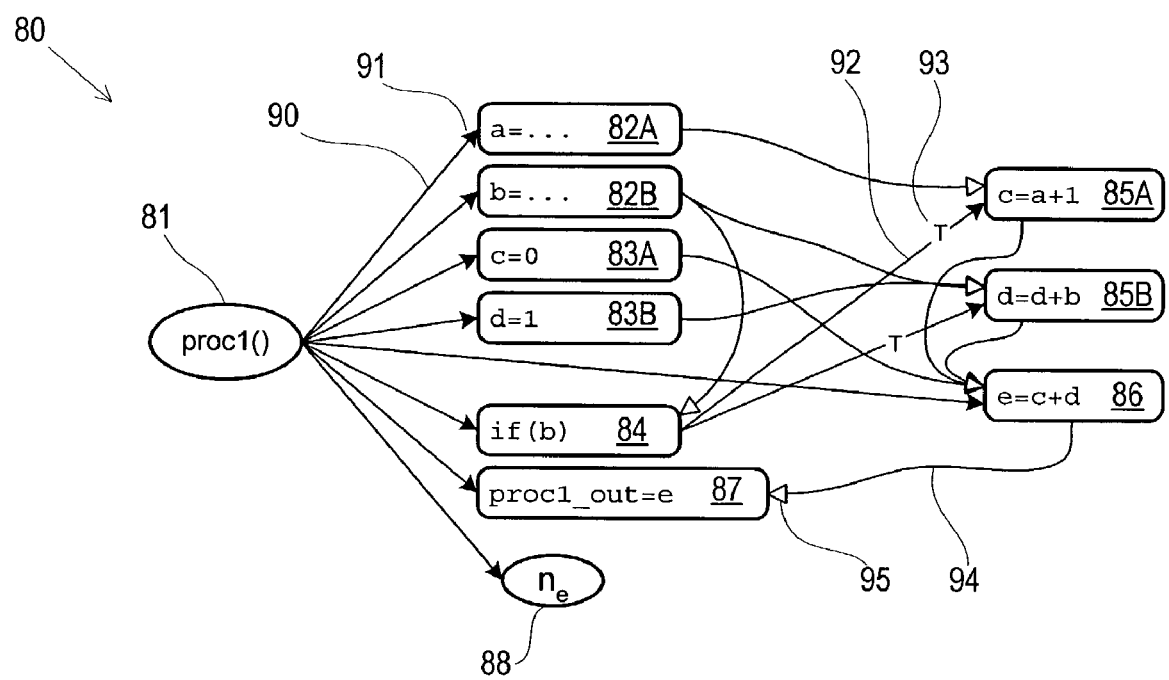
FIG. 5 depicts a procedure dependence graph representation of procedure proc 1( )

FIG. 5 illustrates an example of a program dependence graph 80. An entry node 81 is the root of the control dependences. A group of nodes 82A, 82B, 83A, 83B, 84, 86, 87, 88 are operations that are control dependent on node 81. Node 82A and node 82B are parameter-in nodes. Node 87 is a parameter-out node. A control dependence edge 90 is one of a plurality of control dependence edges. Edge 90 connects node 81 to node 82A. Edge 90 represents the relationship that node 82A is control dependent on node 81. The type of edge, and hence type of dependence relationship, is indicated by a closed arrowhead 91 on edge 90. A group of nodes 85A, 85B is a set of operations that are control dependent on node 84. A control dependence edge 92 connects node 84 to node 85A. Edge 92 is annotated with a label 93 of value "T". Label 93 shows the detailed information that node 85A executes when the predicate at control operation node 84 evaluates to true. A data flow dependence edge 94 is one of a plurality of data flow dependence edges. Edge 94 connects node 86 to node 87. Edge 94 represents the relationship that variables used at node 87 are data flow dependent on the variable definition at node 86. The type of edge, and hence type of dependence relationship, is indicated by a hollow arrowhead 95 on edge 94.

Referring to FIG. 4 and FIG. 5, the nodes of procedure dependence graph 80 correspond directly to the nodes of control flow graph 60. Node 81 corresponds to node 61. Nodes 82A, 82B correspond to group of nodes 62. Nodes 83A, 83B correspond to group of nodes 63. Node 84 corresponds to node 64. Node 85A corresponds to node 65A. Node 85B corresponds to node 65B. Node 86 corresponds to node 66. Node 87 corresponds to node 67. Node 88 corresponds to node 68.

A multiple procedure source code specification is represented by a collection of program dependence graphs with additional edges that represent the interprocedural dependences. The system dependence graph (SDG) for a program Prog is a directed graph $G_{Prog}=(G_{PDG}, E_{Inter})$ consisting of a set of procedure dependence graphs, $G_{PDG}$, and a set of augmenting edges, $E_{Inter}$, that express interprocedural relationships between the PDGS.

The interprocedural relationships between CFGs that concern procedure invocation or procedure calling are modeled by extra nodes. Each procedure call operation or call site in a CFG is hierarchically extended or transformed into detailed operations consisting of four operation types. (1) A call node acts as a control operation that activates execution of the remaining detailed operations. (2) An actual-in node models each passed parameter as an assignment to a temporary variable. (3) A continue node models the next operation that executes after a called procedure returns. (4) An actual-out node represents each returned value from the called procedure as an assignment from a temporary variable. Any global variables used in a called routine are modeled using actual-in and actual-out nodes to track data flow dependences. All actual-out nodes are control dependent on the continue node. These detailed nodes with accompanying control dependences appear in the PDG.

In terms of a CFG, the true conditional control flow from the call node activates all actual-in nodes, and the last actual-in node is virtually connected to the called procedure entry node via an unconditional control flow. This virtual connection results in the called procedure entry node being control dependent on the call node through a special call dependence. An unconditional control flow virtually connects the called procedure terminal node to the continue node. The call edge and the return edge are labeled with a unique identifier that is the calling context.

Figure 6:
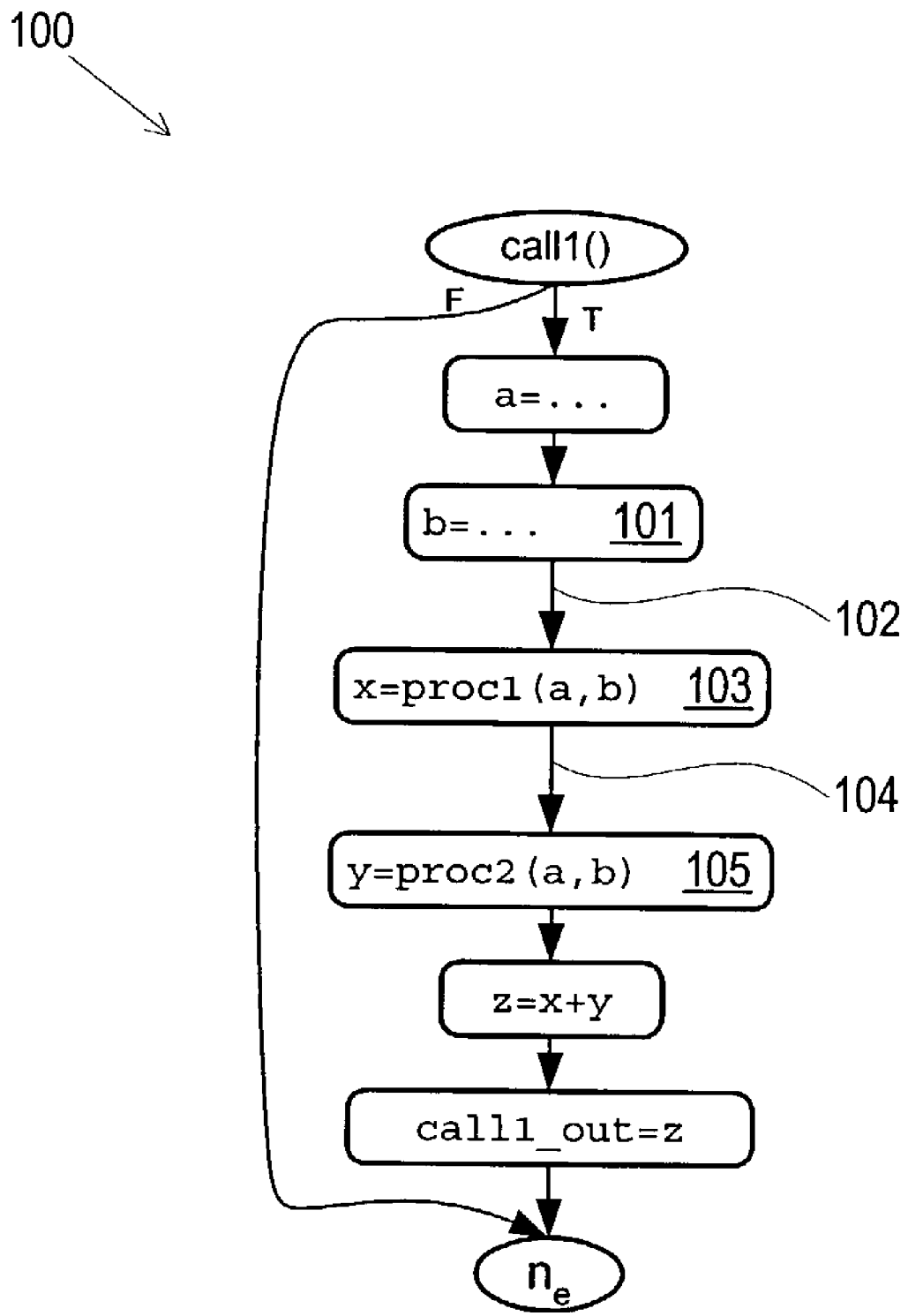
FIG. 6 depicts control flow graph representation of procedure call 1( )

FIG. 6 illustrates an example of unified specification 22 as a control flow graph 100 that defines a procedure call 1( ). A procedure call node 103 represents a procedure call statement from some source code specification. A node 101 is an operation in CFG 100. A node 105 is also an operation in CFG 100. Node 101 is connected to node 103 with a control flow edge 102, and node 103 is connected to node 105 with a control flow edge 104.

Figure 7:
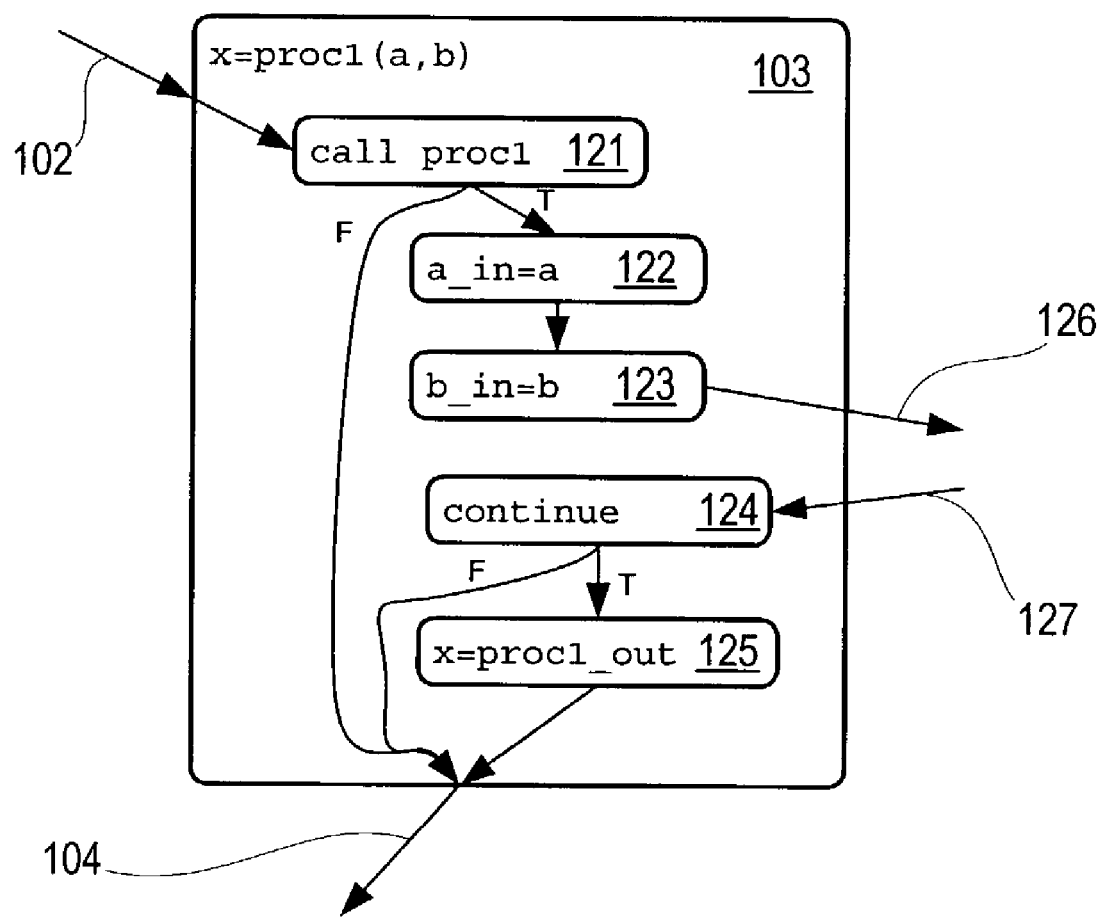
FIG. 7 shows the detail of a call site expanded into detailed operations.

FIG. 7 illustrates how the procedure call node 103 of FIG. 6 is expanded into detailed operations to support interprocedural relationships. Node 103 is connected to the original CFG nodes with edges 102, 104. Node 103 hierarchically represents several nodes. A call node 121 is the source of a control dependence for all detailed nodes. A plurality of actual-in nodes 122, 123 represents the assignment of passed parameters to a temporary variable. A continue node 124 represents the next operation to execute after the procedure call returns. An actual-out node 125 represents assignment from the returned value to a local variable. A virtual control flow edge 126 represents the control flow from last actual-in node 123 to the called procedure entry node. A virtual control flow edge 127 represents the control flow from the called procedure terminal node to continue node 124.

In the SDG representation, there are four types of interprocedural edges linking the hierarchically extended call site to the called procedure. (1) A call edge connects a call node to the entry node of the called procedure. (2) A return edge connects the called procedure terminal node to the continue node. (3) A param-in edge connects the actual-in nodes to the corresponding parameter-in nodes in the called procedure. (4) A param-out edge connects the parameter-out nodes in the called procedure to the corresponding actual-out nodes. Each call site is a unique calling context. The call site interprocedural edges associated with a particular call site are annotated with the calling context. This allows procedure calls and returns to be correlated to a particular call site, since multiple procedure calls to single procedure may exist in the source code specification.

As an implementation note, a return edge does not imply a control dependence between the called procedure terminal node and the continue node. In the normal operation of a system, a called procedure always returns, and thus the return edge provides no information as to whether or not the continue node executes. A called procedure that causes the entire system to halt would give significance to the return edge.

Figure 8:
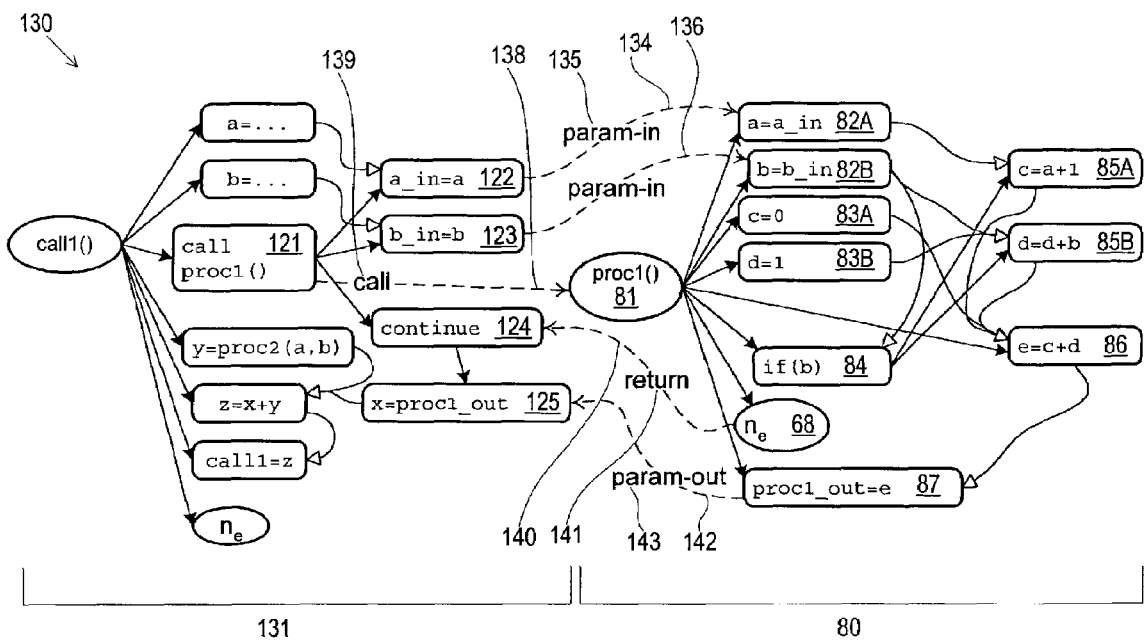
FIG. 8 depicts a system dependence graph based on procedure call 1( ) and proc 1( )

FIG. 8 illustrates an example system dependence graph 130. Example 130 represents a system with two procedures specified by control flow graph 60 of FIG. 4 and control flow graph 100 of FIG. 6. In FIG. 8, a procedure dependence graph 131 represents dependences of control flow graph 100, and procedure dependence graph 80 represents dependence of control flow graph 60. A param-in dependence edge 134 connects actual-in node 122 to param-in node 82A. Edge 134 is annotated with a label 135 to indicate the type of interprocedural dependence. A param-in edge 136 connects actual-in node 123 to param-in node 82B. A call edge 138 connects call node 121 to entry node 81. Edge 138 is annotated with a label 139 to indicate the type of interprocedural dependence. A return edge 140 connects terminal node 68 to continue node 124. Edge 140 is annotated with a label 141 to indicate the type of interprocedural dependence. A param-out edge 142 connects param-out node 87 to actual-out node 125. Edge 142 is annotated with a label 143 to indicate the type of interprocedural dependence.

Three dependences are defined that exist between processes. These dependences may be specified in the source code specification if the language supports these constructs, or these dependences may exist by convention as explained in databooks, programming guides, or other specifications.

An interference dependence is a data flow dependence resulting from the definition and use of a variable that is common to operations that may execute in parallel or concurrent processes.

Let $G_1$ and $G_2$ be CFGs with a shared variable v. Let $n_1$ be a node $G_1$ and $n_2$ be a node in $G_2$. Node $n_2$ is interference dependent on $n_1$ if and only if 1. $n_1$ and $n_2$ may potentially execute in parallel; and
2. node $n_1$ defines v and node $n_2$ uses v.

If a communication channel exists between processes such that an assignment to the channel results in the activation of a process, then there is a signal dependence. Let $G_1$ and $G_2$ be CFGs with a common communication channel w. Let $n_1$ be a node in $G_1$. The CFG $G_2$ is signal dependent on $n_1$ if and only if:

1. $G_1$ and $G_2$ may execute in parallel; and
2. node $n_1$ writes a message to w such that $G_2$ may be activated.

If the side effect of a memory access by an operation results in the activation of a process, then there is an access dependence. Let $G_1$ and $G_2$ be CFGs. Let $n_1$ be a node in $G_1$. Let variable v be a shared variable to which $G_1$ can explicitly access. The CFG $G_2$ is access dependent on $n_1$ if and only if 1. $G_1$ and $G_2$ may execute in parallel; and
2. node $n_1$ uses or defines a variable v; and
3. a use or definition of v may activate $G_2$.

The key differentiating feature of the access dependence is the lack of an explicit communication channel between the procedures.

In the SDG representation, there are three types of interprocess dependence edges that link nodes in separate processes. (1) A signal edge connects a node to a procedure entry node, which represents signal dependence between the source node and the control flow graph containing the entry node (the target node of the edge). (2) An interfer edge connects a node to another node, which represents that the target node is interference dependent on the source node. (3) An access edge connects a node to a procedure entry node, which represents access dependence between the source node and the control flow graph containing the entry node (the target node of the edge).

Figure 9:
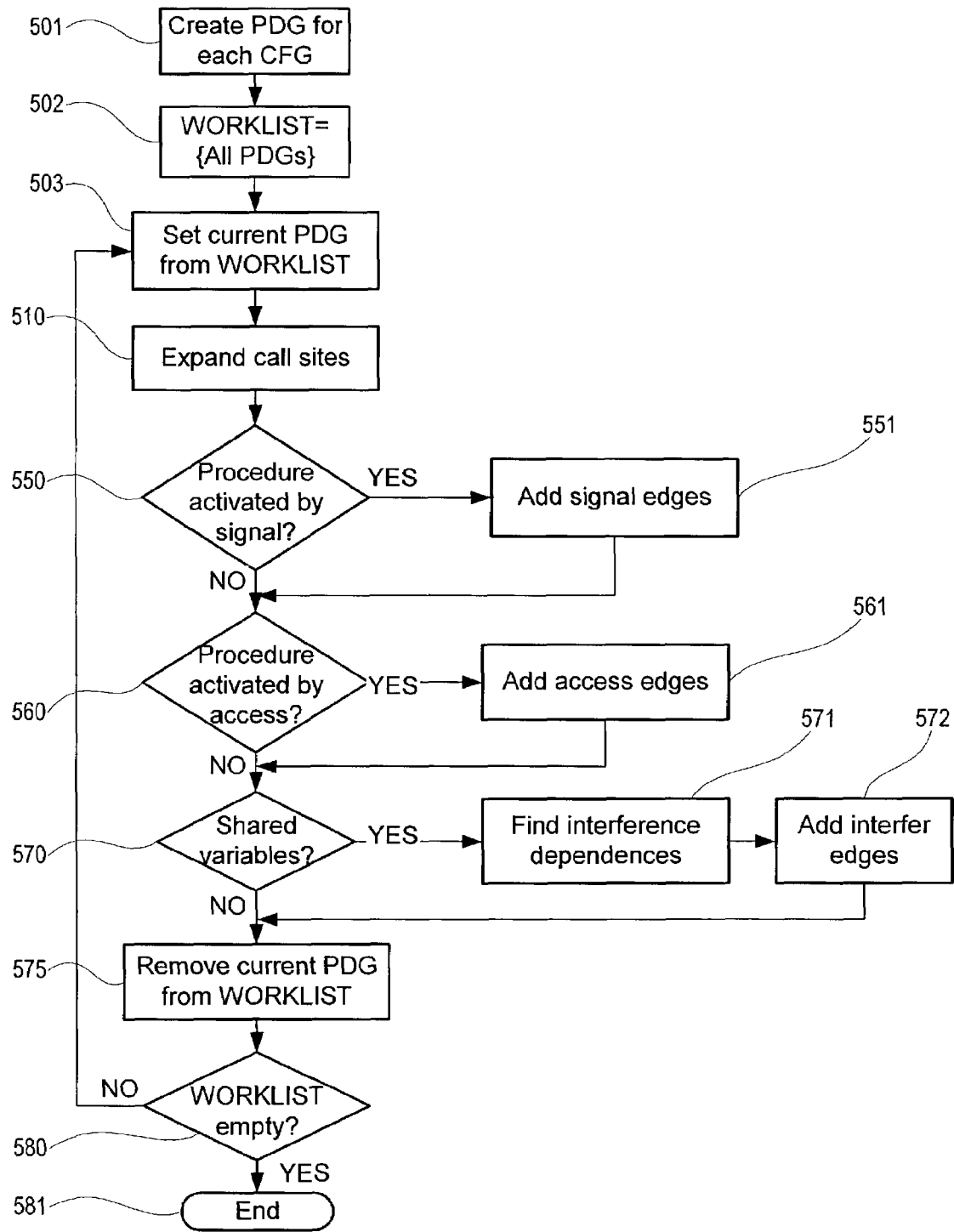
FIG. 9 shows a flow chart of the process to create a system dependence graph.

FIG. 9 shows a flow chart of the process to create system dependence graph 24. A first step 501 creates a PDG in system dependence graph 24 for each CFG in unified specification 22. Next, a step 502 initializes a WORKLIST variable to the set of all PDGs. The WORKLIST variable is used to iterate through all PDGs. A step 503 sets the current working PDG by removing the next one from WORKLIST variable. A step 510 expands each procedure call site into the detailed operations to represent the interprocedural dependences. A step 550 determines if the procedure represented by the current PDG is activated by a signal. A step 551 adds a signal edge for each operation that may activate the current PDG based on the result of step 550. For each edge in added in step 551, the signal edge connects the source node in the separate process to the entry node in the current PDG. A step 560 determines if the procedure represented by the current PDG is activated by a variable access. A step 561 adds an access edge for each operation that may activate the current PDG based on the result of step 560. For each edge in added in step 561, the signal edge connects the source node in the separate process to the entry node in the current PDG. A step 570 determines if the procedure represented by the current PDG contains shared variables. If step 570 determines shared variables are present, a step 571 processes each shared variable to find any interference dependences that exist on shared variables. A step 572 adds an interfer edge for each interference dependence found in step 571. For each edge in added in step 572, the interfer edge connects the source node in the separate process to the target node in the current PDG. A step 575 removes the current PDG from WORKLIST variable. A step 580 determines if WORKLIST variable is empty. If WORKLIST is not empty, the process iterates starting with step 503. When WORKLIST is empty in step 580, the system dependence graph is complete as indicated by a terminal symbol 581.

Figure 10:
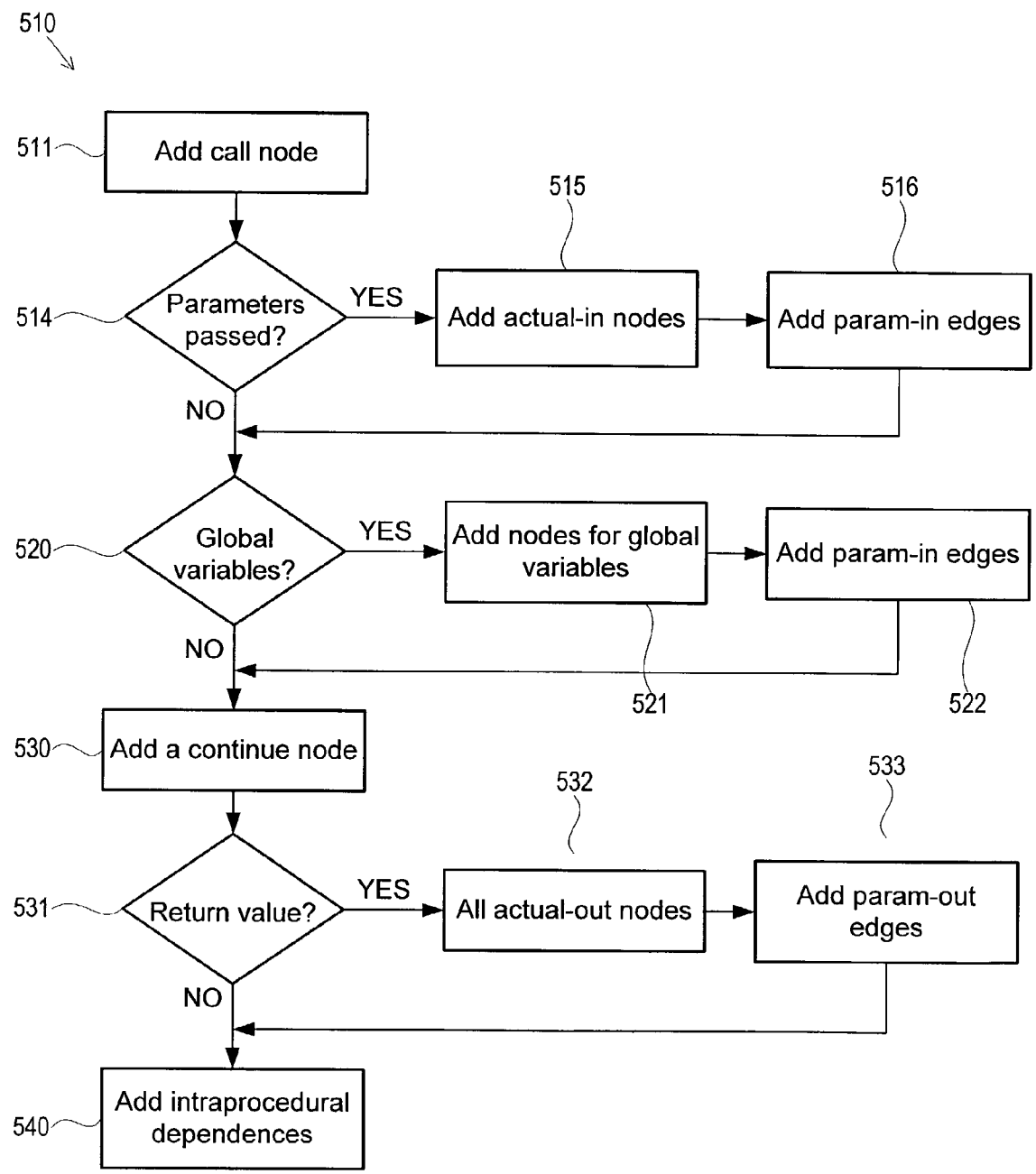
FIG. 10 shows a detailed flow chart for expanding a call site into detailed operations.

FIG. 10 shows a flowchart of the detailed steps that implement step 510. A step 511 replaces the call operation that is the call site with a call node. A step 514 determines if any parameters are passed to the called procedure. If step 514 is true, a step 515 adds an actual-in node for each passed parameter. A step 516 adds a param-in edge for each actual-in node added in step 515. For each edge in step 516, the param-in edge connects the actual-in node at the call site to the parameter-in node in the called procedure. A step 520 determines if any global parameters are used in the called procedure. If step 520 is true, a step 521 adds an actual-in node and parameter-in node for each global variable used in the called procedure. A step 522 adds a param-in edge for each actual-in node added in step 521. For each edge in step 522, the param-in edge connects the actual-in node at the call site to the parameter-in node in the called procedure. A step 530 adds a continue node and a return edge from the called procedure terminal node to the continue node. A step 531 determines if a value is returned by the called procedure. If step 531 is true, a step 532 adds an actual-out node for each returned value. A step 533 adds a param-out edge for each actual-out node added in step 532. For each edge in step 533, the param-out edge connects the parameter-out node in the called procedure to the actual-out node at the call site. A step 540 adds intraprocedural edges to the PDG containing the call site based on the nodes added in the previous steps.

Operation of the preferred embodiment is demonstrated in the following example.

Figure 11:
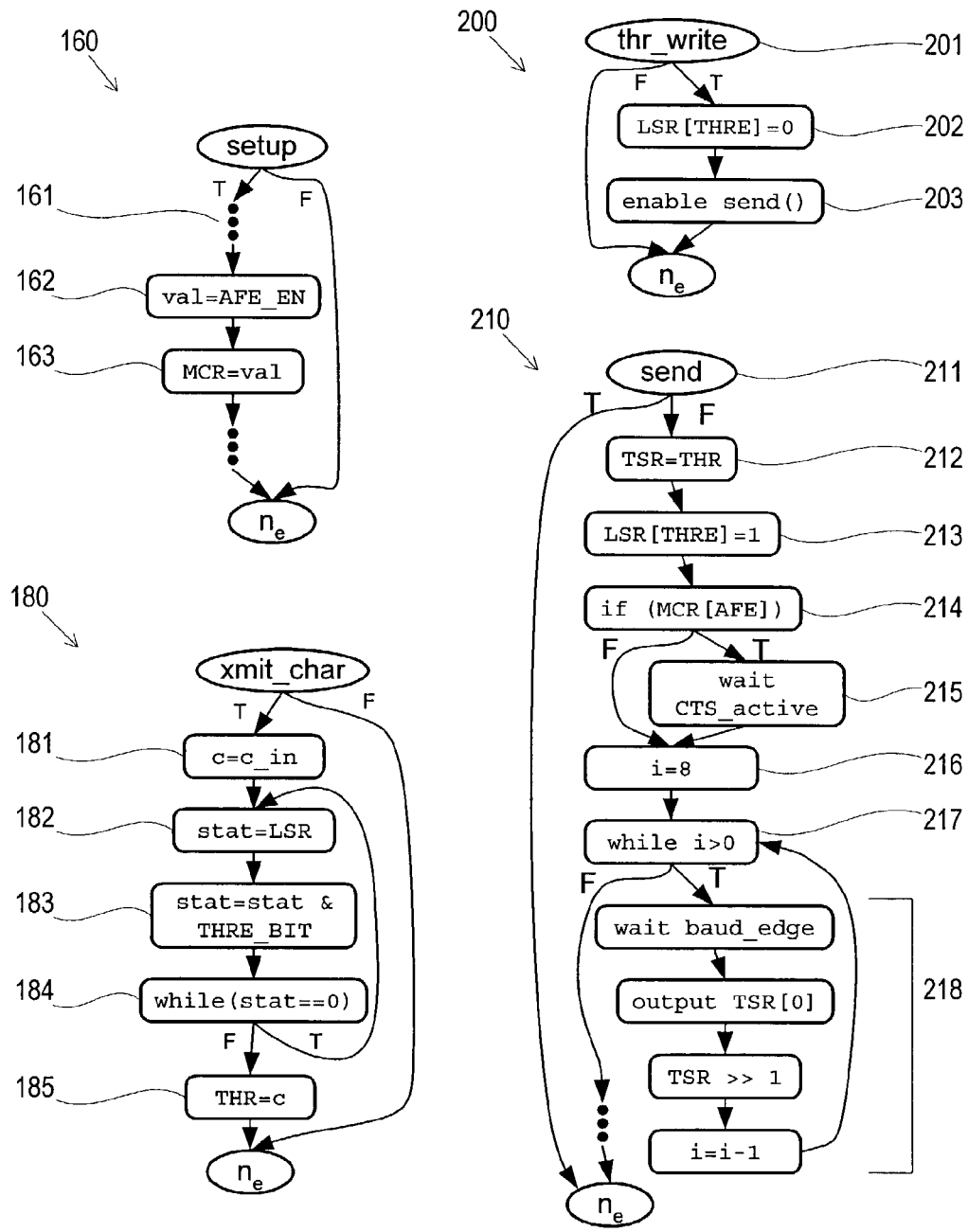
FIG. 11 depicts four concurrent processes specified as control flow graphs.

FIG. 11 illustrates an example of unified specification 22 as four control flow graphs specifying four processes that demonstrate interprocess dependences. The example specification is based on the transmit path for a 550 universal asynchronous receiver/transmitter (UART), a hardware component widely used in embedded system design, both as a discrete chip and as a core in integrated circuit designs [Texas Instruments, TL16C550C data sheet, Pub. No. SLLS177F, March 2001]. A CFG 160 specifies a software procedure setup( ). A set of three dots 161 indicates a portion of the CFG is not specified in this example. An operation 162 assigns a value that sets a bit to enable auto flow control. An operation 163 writes the bit to a MCR register on the UART, thereby enabling auto flow control.

A control flow graph 180 in FIG. 11 specifies a software procedure xmit_char( ). A parameter-in node 181 indicates there is one input parameter "c". A node 182 reads a LSR register on the UART. A node 183 specifies an operation that masks out a THRE bit in the LSR register. A control operation node 184 specifies a loop that causes execution of nodes 182, 183, 184 while the THRE bit is zero. A node 185 writes the input parameter "c" to a THR register on the UART. The loop implements a busy wait on the LSR register to check when the THRE bit is zero, which indicates a THR register on the UART is empty. The write of the THR registers at node 185 causes the value in input parameter "c" to be transmitted by the UART.

A control flow graph 200 in FIG. 11 specifies a hardware procedure thr_write( ). An entry node 201 is part of CFG 200. A node 202 assigns zero to the THRE bit in the LSR register on the UART. A node 203 specifies an operation that sends a signal. A CFG 210 specifies a hardware procedure send( ). An entry node 211 is part of CFG 210. A node 212 assigns the value from the THR register to a register TSR on the UART. A node 213 assigns the value 1 to the THRE bit of the LSR register. A control operation node 214 uses the value of the bit that controls auto flow control of the MCR register as the control operation predicate. A node 215 executes if the predicate from node 214 is true. A node 216 assigns a value to a variable "i". A control operation node 217 controls a set of nodes 218 that form a loop that executes eight times based on the assigned value at node 216. The loop 218 causes a bit to be transmitted.

The THR register on the UART is a shared variable that is written by node 185 and read by node 212. This demonstrates that node 212 is interference dependent on node 185. When the THR register is accessed from outside the hardware, it has the side effect of firing CFG 200. This demonstrates that the process specified by CFG 200 is access dependent in node 185. The LSR register on the UART is a shared variable that is written by nodes 202, 213 and read by node 182. This demonstrates that node 182 is interference dependent on both node 202 and node 213. The MCR register on the UART is a shared variable that is written by node 163 and read by node 214. This demonstrates that node 214 is interference dependent on node 163. The operation of node 203 sends a signal to control flow graph 210. This demonstrates that control flow graph 210 is signal dependent on node 203.

Figure 12:
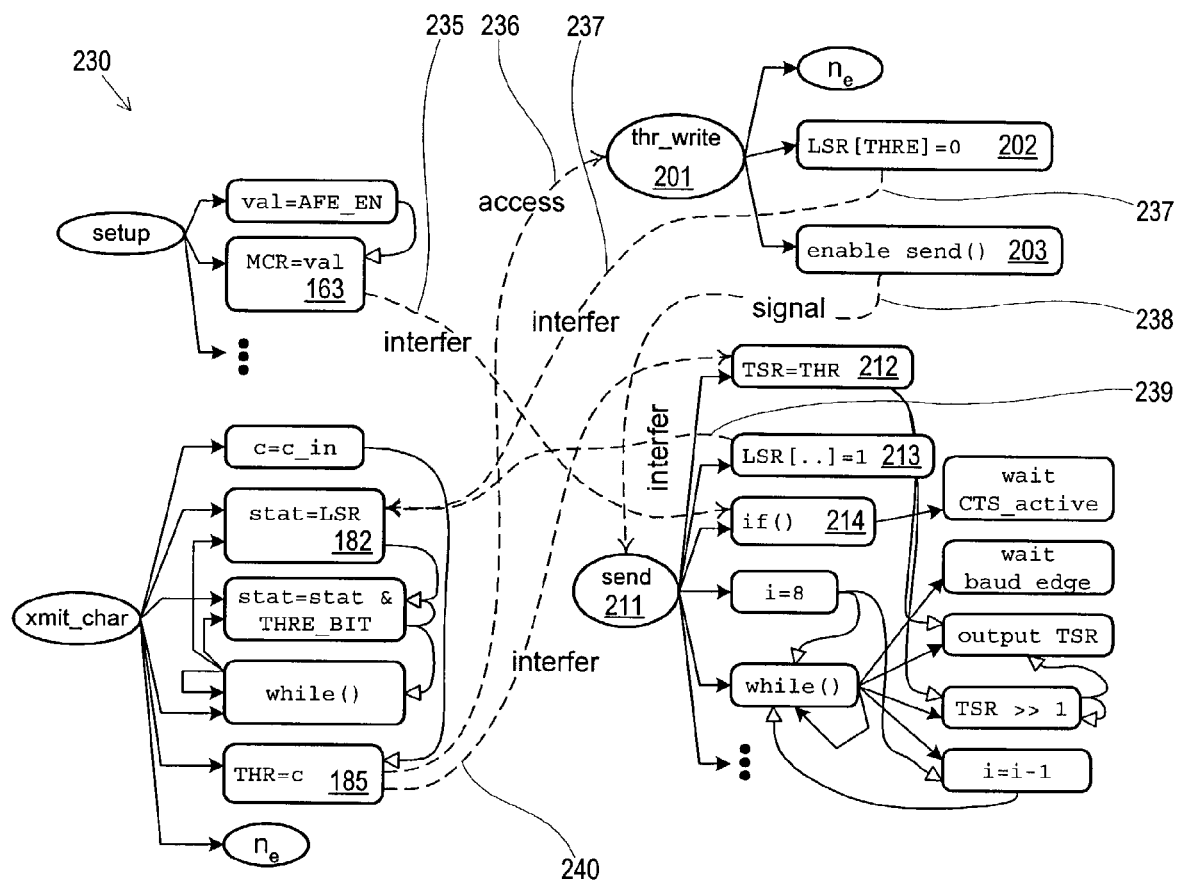
FIG. 12 depicts an example system dependence graph with interprocess dependence edges.

FIG. 12 illustrates an example system dependence graph 230 based on the four control flow graphs 160, 180, 200, 210. An interfer edge 235 from node 163 to node 214 represents the interference dependence between nodes 163 and 214. An access edge 236 from node 185 to entry node 201 represents the access dependence between node 185 and control flow graph 200. An interfer edge 237 from node 202 to node 182 represents the interference dependence between node 202 and 182. A signal edge 238 from node 203 to entry node 211 represents the signal dependence between node 203 and control flow graph 210. An interfer edge 239 from node 213 to node 182 represents the interference dependence between node 213 and node 182. An interfer edge 240 from node 185 to node 212 represents the interference dependence between node 135 and node 212.

As a practical matter, contemporary software programming language specifications and hardware description language specifications 10, 12 are expressed using different languages. In the preferred embodiment, source code specifications in languages incapable of expressing the notion of processes, concurrency, access sensitivity, and signal sensitivity require additional specification in the form of user command input 16. An alternate embodiment allows the designer to specify user input 16 to directly annotate unified specification 22 with the dependences that are unsupported by the languages of the source code specifications 10, 12. Yet another embodiment allows the user to extend the source code specification languages with non-standard constructs in order to specify the unsupported dependences.

Detailed Description—Slice Computation

A slicing criterion is defined as a program point p, which is a node in system dependence graph 24. A program slice is defined as a subgraph of the system dependence graph that contains all nodes that may influence the operation at the slicing criterion. The slice for a criterion with multiple program points is computed as a union of slices, one slice for each node in the criterion.

For a program consisting of a single procedure, the SDG is a single procedure dependence graph. In this simple intraprocedural case, the slice is computed by analyzing the PDG for transitive flow and control dependences from the slicing criterion. That is, all nodes that can reach the slicing criterion node via the dependence edges belong to the slice.

Figures 13, 14:
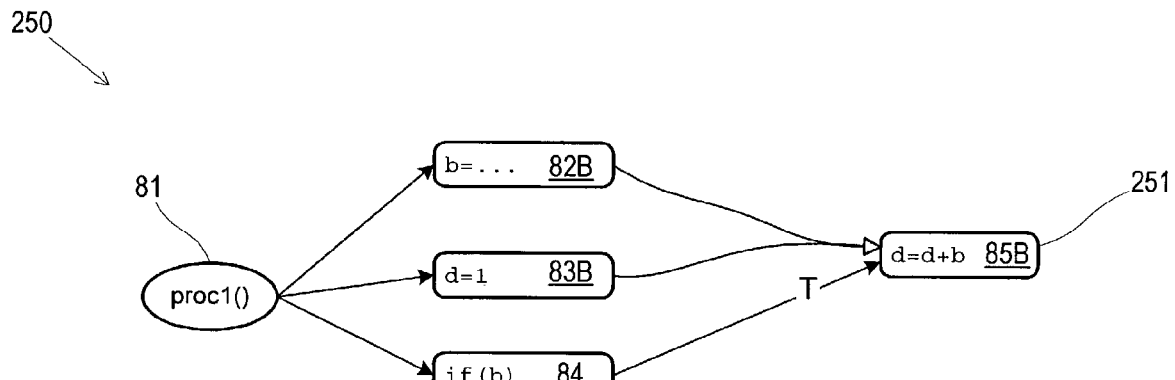
FIG. 13 depicts a slice as a subgraph of a system dependence graph.
FIG. 14 depicts a slice as an annotated source code specification.

FIG. 13 illustrates an example of source code slice 26 as a slice 250 computed from program dependence graph 80. A slicing criterion 251 is node 85B. The slice of FIG. 13 is a subgraph of program dependence graph 80. Slice 250 was calculated as follows. From criterion 251, which is node 85B, each inbound dependence edge was followed to the respective source node, yielding nodes 82B, 83B, 84 as members of the slice. From each of nodes 82B, 83B, and 84, each inbound dependence edge was followed to the respective source node, yielding node 81 in every case. Since node 81 is the root node of the program dependence graph, there are no more edges to follow.

FIG. 14 illustrates one embodiment of example slice 250 as viewed on display 14 as annotated source code 260. Displayed slice 260 indicates slice statements as underlined statements. A box 261 indicates slicing criterion 251. A portion of a statement 262 is underlined to indicate it belongs to slice 250. A statement 264 is also underlined to indicate it belongs to slice 250. Portion of statement 262 is indicated as belonging to slice 250 based on node 81 in slice 250. Statement 264 is indicated as belonging to slice 250 based on node 84 in slice 250.

In a multiple procedure SDG, the slice is found by transitively following all control, data flow, and param-out edges. The call and param-in edges that are encountered are followed by taking into account the calling context to improve precision of the computed slice. If a param-out had been previously followed, then the current transitive dependence path is in a procedure calling context. When a call or param-in edge is encountered, only an edge with the matching calling context back to the call site is followed. However, if the current transitive dependence has not descended into a function call, meaning the slicing criterion is in a procedure that may be called by other procedures, then all call and param-in edges are followed since there is no calling context.

FIG. 15 specifies a worklist algorithm for computation of a slice. The algorithm processes a system dependence graph consisting of multiple procedures that may execute in parallel, but without procedure calls across processes. All called procedures in the system dependence graph are assumed to return from the procedure call. The types of edges processed by the algorithm of FIG. 15 are: control, data flow, call, param-in, param-out, interfer, signal, and access. The interprocedural edges (param-in, param-out, and call) are uniquely labeled with a calling context for each procedure call operation.

In the algorithm of FIG. 15, a marked node means it is part of the slice, and a visited node means all inbound edges have been considered for the current calling context. The set of visited nodes is tracked separately for each calling context.

A call context stack is associated with each node in the algorithm to track the particular sequence of procedure calls. When the algorithm descends into a function call, that is a param-out edge is followed, the current calling context from the param-out edge label is pushed on a call stack. The algorithm ascends from a function call (via call or param-in edge) if the current calling context matches the edge label, at which time the calling context is popped off stack. Initially the stack is empty, and an empty stack matches all labels. This occurs when the criterion is in the same procedure whose entry node is reached, yet there are inbound call edges to follow. Since no calling context exists, all potential function calls are followed.

When a new process is entered (via interference, signal, or access edge), the call stack is reset, since procedure calls only occur within a process. Additionally, when a process boundary is crossed following an interfer edge, the process order is validated to insure a feasible execution is under consideration. The dependence edges and the actions within the algorithm are summarized in the following table.

| SDG Edge Type | Condition to follow edge | Next edges to follow | Traversal state change |
| --- | --- | --- | --- |
| Control | None | All | None |
| Flow | None | All | None |
| Call | Valid call context | All | Call depth decrease |
| Param-in | Valid call context | All | Call depth decrease |
| Param-out | None. | All | Call depth increase |
| Interfer | Feasible process order | All | New process |
| Signal | None | All | New process |
| Access | None | Control only | New process |

The action of computing the slice is tuned or adjusted by specifying the type of edges followed in the system dependence graph. The user specifies a set of edges to include when computing the slice. Such a set stored as a portion of slicing parameters 30. The algorithm of FIG. 15 is modified to first verify that any edges to be followed are included in the user specified set. Thus, the any edges excluded from the user specified set are ignored by the algorithm of FIG. 15.

An alternate embodiment allows a user to specify a set of edges to exclude from slice computation. Such as set is converted into a set of edges to include, and operation proceeds as previously described.

An embodiment of the present invention, a design automation method to transform a source code specification into a simplified representation called a slice, is thus described. While the present invention has been described in particular embodiments, it should be appreciated that the present invention should not be construed as limited by such embodiments, but rather construed according to the following claims.

What I claim as my invention is:

1. A computer implemented method for constructing a system dependence graph for a unified specification, said unified specification comprising a description of behavior in terms of a multitude of operations, organized as one or more processes that represent concurrent behavior, each of said processes specified as one or more procedures, each of said procedures specified as a sequential flow of control between operations and each of said procedures containing one entry operation, said entry operation being a control predicate operation that models procedure activation, comprising the steps of:
  (a) for each procedure in said unified specification, constructing a procedure dependence graph, where each node in said procedure dependence graph corresponds to an operation in said unified specification and each edge in said procedure dependence graph corresponds to a dependence relation between two operations in the same procedure;
  (b) connecting said procedure dependence graphs by introducing a plurality of interprocedural edges, said interprocedural edges representing interprocedural dependences, where each said interprocedural edge is labeled with a type comprising call, return, param-in, and param-out;
  (c) connecting said procedure dependence graphs by introducing a plurality of interprocess edges, said interprocess edges representing interprocess dependences, each of said interprocess edges connecting a source node and a target node that represent concurrent operations;
  (d) storing the system dependence graph to an output medium;
  whereby the multitude of dependence relationships between said operations in said unified specification are explicitly represented.

2. A computer implemented method for constructing a system dependence graph for a unified specification, said unified specification comprising a description of behavior in terms of a multitude of operations, organized as one or more processes that represent concurrent behavior, each of said processes specified as one or more procedures, each of said procedures specified as a sequential flow of control between operations and each of said procedures containing one entry operation, said entry operation being a control predicate operation that models procedure activation, comprising the steps of:
  (a) for each procedure in said unified specification, constructing a procedure dependence graph, where each node in said procedure dependence graph corresponds to an operation in said unified specification and each edge in said procedure dependence graph corresponds to a dependence relation between two operations in the same procedure;
  (b) connecting said procedure dependence graphs by introducing a plurality of interprocedural edges, said interprocedural edges representing interprocedural dependences, where each said interprocedural edge is labeled with a type comprising call, return, param-in, and param-out;
  (c) connecting said procedure dependence graphs by introducing a plurality of interprocess edges, said interprocess edges representing interprocess dependences, each of said interprocess edges connecting a source node and a target node that represent concurrent operations, wherein one type of said interprocess edge is an access edge, said access edge representing an access dependence between an operation represented by said source node and a procedure, said procedure entry operation represented by said target node;
  (d) storing the system dependence graph to an output medium;
  whereby the multitude of dependence relationships between said operations in said unified specification are explicitly represented.

3. The method as recited in claim 1, wherein said unified specification describes an embedded system.

4. A computer implemented method for constructing a system dependence graph for a unified specification that describes an embedded system, said unified specification comprising a description of behavior in terms of a multitude of operations, organized as one or more processes that represent concurrent behavior, each of said processes specified as one or more procedures, each of said procedures specified as a sequential flow of control between operations and each of said procedures containing one entry operation, said entry operation being a control predicate operation that models procedure activation, comprising the steps of:
  (a) for each procedure in said unified specification, constructing a procedure dependence graph, where each node in said procedure dependence graph corresponds to an operation in said unified specification and each edge in said procedure dependence graph corresponds to a dependence relation between two operations in the same procedure;
  (b) connecting said procedure dependence graphs by introducing a plurality of interprocedural edges, said interprocedural edges representing interprocedural dependences, where each said interprocedural edge is labeled with a type comprising call, return, param-in, and param-out;
  (c) connecting said procedure dependence graphs by introducing a plurality of interprocess edges, said interprocess edges representing interprocess dependences, each of said interprocess edges connecting a source node and a target node that represent concurrent operations, wherein one type of said interprocess edges is an access edge, said access edge representing an access dependence between an operation represented by said source node and a procedure, said procedure entry operation represented by said target node;
  (d) storing the system dependence graph to an output medium;
  whereby the multitude of dependence relationships between said operations in said unified specification are explicitly represented.

5. The method as recited in claim 4, wherein said operation of said access dependence is a software operation and said procedure of said access dependence is a hardware procedure.

6. The method as recited in claim 3, wherein one type of said interprocess edges is a signal edge, said signal edge representing a signal dependence between a software operation and a hardware procedure.

7. The method as recited in claim 3, wherein one type of said interprocess edges is a signal edge, said signal edge representing a signal dependence between a hardware operation and a software procedure.

8. The method as recited in claim 3, wherein one type of said interprocess edges is an interfer edge, said interfer edge representing an interference dependence between two operations, one of said two operations being a software operation and the other of said two operations being a hardware operation.

9. A computer implemented method for calculating a slice based on a system dependence graph, said system dependence graph representing a plurality of dependences between operations in a unified specification, said dependences represented by edges of said graph, said operations represented by nodes of said graph, types of said dependences comprising intraprocedural, interprocedural, and interprocess, said unified specification comprising a description of behavior in terms of a multitude of operations, organized as one or more processes that represent concurrent behavior, each of said processes specified as one or more procedures, each of said procedures specified as a sequential flow of control between operations comprising the steps of:
(a) identifying a slicing criterion as initial elements of said slice;
(b) adding a subset of said operations to said slice based on a plurality of intraprocedural dependences;
(c) adding a subset of said operations to said slice based on a plurality of interprocedural dependences;
(d) adding a subset of said operations to said slice based on a plurality of interprocess dependences, said interprocess dependence represented by said interprocess edge connecting a source node and a target node that represent concurrent operations;
whereby a slice is output for the purpose of viewing by a user.

10. A computer implemented method for calculating a slice based on a system dependence graph, said system dependence graph representing a plurality of dependences between operations in a unified specification, said dependences represented by edges of said graph, said operations represented by nodes of said graph, types of said dependences comprising intraprocedural, interprocedural, and interprocess, said unified specification comprising a description of behavior in terms of a multitude of operations, organized as one or more processes that represent concurrent behavior, each of said processes specified as a one or more procedures, each of said procedures specified as a sequential flow of control between operations comprising the steps of:
(a) identifying a slicing criterion as initial elements of said slice;
(b) adding a subset of said operations to said slice based on a plurality of intraprocedural dependences;
(c) adding a subset of said operations to said slice based on a plurality of interprocedural dependences;
(d) adding a subset of said operations to said slice based on a plurality of interprocess dependences, said interprocess dependence represented by said interprocess edge connecting a source node and a target node that represent concurrent operations, wherein one type of said interprocess dependences is an access dependence, said access dependence between an operation represented by said source node and a procedure represented by said target node;
whereby a slice is output for the purpose of viewing by a user.

11. The method as recited in claim 10, wherein said operation of said access dependence is a software operation and said procedure of said access dependence is a hardware procedure.

12. The method as recited in claim 9, wherein one type of said interprocess dependences is a signal dependence between a software operation and a hardware procedure.

13. The method as recited in claim 9, wherein one type of said interprocess dependences is a signal dependence between a hardware operation and a software procedure.

14. The method as recited in claim 9, wherein one type of said interprocess dependences is a interference dependence between two operations, one of said two operations being a software operation and the other of said two operations being a hardware operation.

15. The method as recited in claim 9, wherein slice calculation parameters specify which of said dependences to consider during computation of said slice.

16. A programmed computer machine for computing a slice of a unified specification, said unified specification comprising a description of behavior in terms of a multitude of operations, organized as one or more processes that describe concurrent behavior, each of said processes specified as a one or more procedures, each of said procedures specified as a sequential flow of control between operations, comprising:
(a) providing a storage medium for representing a unified specification;
(b) providing a processor which transform said unified specification into a system dependence graph, said system dependence graph representing a plurality of intraprocedural dependences, interprocedural dependences, and interprocess dependences;
(c) providing a storage medium which is able to represent said system dependence graph;
(d) providing a processor which compute a slice from said system dependence graph based on said plurality of intraprocedural dependences, interprocedural dependences, and interprocess dependences;
(e) providing a storage medium which is able to represent said slice;
(f) providing a display which is operationally connected to said storage medium for displaying said slice,
whereby said display will output said slice.

17. A programmed computer machine for computing a slice of a unified specification, said unified specification comprising a description of behavior in terms of a multitude of operations, organized as one or more processes that describe concurrent behavior, each of said processes specified as a one or more procedures, each of said procedures specified as a sequential flow of control between operations, comprising:
(a) providing a storage medium for representing a unified specification;
(b) providing a processor which transform said unified specification into a system dependence graph, said system dependence graph representing a plurality of intraprocedural dependences, interprocedural dependences, and interprocess dependences;
(c) providing a storage medium which is able to represent said system dependence graph;
(d) providing a processor which compute a slice from said system dependence graph based on said plurality of intraprocedural dependences, interprocedural dependences, and interprocess dependences, wherein one type of said interprocess dependences is an access dependence, said access dependence existing between an operation and a procedure, said operation represented by a source node, said procedure represented by a procedure entry operation that is represented by a target node, said source node and said target node representing concurrent operations connected by an access edge representing said access dependence;
(e) providing a storage medium which is able to represent said slice;
(f) providing a display which is operationally connected to said storage medium for displaying said slice,
whereby said display will output said slice.

18. The programmed computer of claim 17, wherein said operation of said access dependence is a software operation and said procedure of said access dependence is a hardware procedure.

19. The programmed computer of claim 16, further including storage to represent a set of dependences to exclude from said processor means which compute said slice.

20. The programmed computer of claim 17, further including a storage to represent a set of dependences to exclude from said processor which compute said slice.

* * * * *